(12) United States Patent
Pan et al.

(10) Patent No.: US 8,890,164 B1
(45) Date of Patent: Nov. 18, 2014

(54) APPARATUS AND METHOD FOR REDUCING PLASMA-INDUCED DAMAGE IN PMOSFETS

(75) Inventors: Hong-Tsz Pan, Cupertino, CA (US); Qi Lin, Cupertino, CA (US); Yun Wu, San Jose, CA (US); Bang-Thu Nguyen, Santa Clara, CA (US)

(73) Assignee: Xilinx, Inc., San Jose, CA (US)

( * ) Notice: Subject to any disclaimer, the term of this patent is extended or adjusted under 35 U.S.C. 154(b) by 62 days.

(21) Appl. No.: 13/416,297

(22) Filed: Mar. 9, 2012

(51) Int. Cl.
 *H01L 27/108* (2006.01)
(52) U.S. Cl.
 USPC .................. 257/69; 257/E21.625; 438/413
(58) Field of Classification Search
 USPC ................ 438/513; 257/69, E21.625
 See application file for complete search history.

(56) References Cited

U.S. PATENT DOCUMENTS

| 2001/0032999 | A1* | 10/2001 | Yoshida | 257/332 |
|---|---|---|---|---|
| 2002/0043688 | A1* | 4/2002 | Van Lieverloo | 257/367 |
| 2004/0085810 | A1* | 5/2004 | Hoenigschmid et al. | 365/158 |
| 2005/0176210 | A1* | 8/2005 | Kim et al. | 438/386 |
| 2010/0025761 | A1* | 2/2010 | Voldman | 257/338 |

OTHER PUBLICATIONS

IBM, *28LP (46E2449) Technology Design Manual*, Dec. 11, 2009, pp. 1-366, IBM Systems and Technology Group, Hopewell Junction, New York, USA.
Lin, Wallace et al., "A Model for an N-Well Junction Effect on Gate-Charging Damage in PMOSFETs," *IEEE Electron Device Letters*, Apr. 2002, pp. 197-199, vol. 23, No. 4, IEEE, Piscataway, New Jersey, USA.

* cited by examiner

*Primary Examiner* — Amar Movva
(74) *Attorney, Agent, or Firm* — Gerald Chan; Lois D. Cartier

(57) ABSTRACT

A metal oxide semiconductor field effect transistor (MOSFET) for an integrated circuit includes a substrate of a first conductivity type, a first well region of a second conductivity type located in the substrate, and a second well region of the second conductivity type located within the substrate. The second well region is functionally connected to the first well region, and the second well region has a surface area greater than a surface area of the first well region. The MOSFET further includes a source of the first conductivity type located in the first well region, a drain of the first conductivity type located in the first well region, a substrate terminal of the second conductivity type located in the first well region, a gate oxide on a top surface of the first well region, and a gate electrode located on a top surface of the gate oxide.

20 Claims, 7 Drawing Sheets

APPARATUS AND METHOD FOR REDUCING PLASMA-INDUCED DAMAGE IN PMOSFETS

FIELD OF THE INVENTION

This application relates generally to metal oxide semiconductor field effect transistors, and in particular, to systems and methods for reducing plasma-induced damage in MOSFETs.

BACKGROUND

Metal oxide semiconductor field effect transistors (MOSFETs) are transistors commonly used for switching electric signals. MOSFETs may be p-type or n-type. A p-type MOSFET (pMOS) typically includes a p-type substrate, an n-well region located within the p-type substrate, a p-type source located within the n-well region, a p-type drain located within the n-well region, a n-well substrate terminal located within the n-well region and an oxide-insulated gate located on top of the n-well region. A voltage on the oxide-insulated gate induces a conducting channel in the n-well region between the source and drain.

In fabricating a p-type MOSFET (pMOS), several processes including plasma-based processes may be performed. Because plasmas comprise charged particles, exposure of the pMOS to plasma induces charged particles within the source, drain, and n-well substrate terminal of the pMOS. These charged particles flow from the drain, source, and n-well substrate terminal into the n-well region of the pMOS. Charged particles built up within the n-well region may then be discharged through the n-well region/p-type substrate junction. However, if the magnitude of charged particles accumulated in the n-well region becomes too great, charged particles residing in the n-well region will also discharge through the gate oxide of the pMOS. This may cause damage to the gate oxide of the pMOS as well as significant degradation in the performance of the pMOS.

Prior approaches involve adding an n-well protection diode within the p-type substrate of the pMOS to help provide additional discharge to the n-well region. However, n-well protection diodes only provide a limited path for additional discharge, which may fail to sufficiently protect the gate oxide from charge damage. Additionally, the n-well protection diode is essentially ineffective for protecting against front-end of the line (FEOL) plasma-based processes.

SUMMARY

In accordance with some embodiments, a metal oxide semiconductor field effect transistor (MOSFET) for an integrated circuit includes a substrate of a first conductivity type, a first well region of a second conductivity type located in the substrate, and a second well region of the second conductivity type located within the substrate. The second well region is functionally connected to the first well region and the second well region has a surface area greater than a surface area of the first well region. The MOSFET further includes a source of the first conductivity type located in the first well region, a drain of the first conductivity type located in the first well region, a substrate terminal of the second conductivity type located in the first well region, a gate oxide on a top surface of the first well region, and a gate electrode located on a top surface of the gate oxide.

In one or more embodiments, the MOSFET further includes a pair of isolation trenches formed in the substrate, wherein each of the isolation trenches is adjacent to the first well region, and an additional isolation trench formed in the first well region, the additional isolation trench isolating the substrate terminal from the source and the drain.

In one or more embodiments, each of the pair of isolation trenches may have a depth anywhere from 0.25 to 0.5 microns.

In one or more embodiments, each of the pair of isolation trenches may have the same depth as the first well region.

In one or more embodiments, each of the isolation trenches may comprise silicon dioxide.

In one or more embodiments, the gate oxide may comprise silicon dioxide.

In one or more embodiments, the MOSFET may further include a protection diode that is functionally connected to the first n-well region through the substrate terminal of the MOSFET by a metal line.

In one or more embodiments, the first conductivity type may be p-type and the second conductivity type may be n-type.

In one or more embodiments, the first conductivity type may be n-type and the second conductivity type may be p-type.

In one or more embodiments, the first well region may have a depth anywhere from 0.25 to 0.5 microns.

In one or more embodiments, the second n-well region may have a depth anywhere from 0.25 μm to 0.5 μm.

In one or more embodiments, the gate electrode may comprise polysilicon or metal.

In accordance with other embodiments, a method for fabricating a metal oxide semiconductor field effect transistor (MOSFET) for an integrated circuit includes forming in a substrate of a first conductivity type, a first well region of a second conductivity type, and a second well region of the second conductivity type. The second well region is formed so that it is functionally connected to the first well region, and the second well region has a surface area greater than a surface area of the first well region. The method further includes forming a gate oxide on a top surface of the first well region, forming a gate electrode on a top surface of the gate oxide, forming a source and a drain of the first conductivity type in the first well region, and forming a substrate terminal in the first well region.

In one or more embodiments, the method may further include forming a pair of isolation trenches in the substrate, wherein each of the isolation trenches is adjacent to the first well region, and forming an additional isolation trench in the first well region, the additional isolation trench isolating the substrate terminal from the source and the drain.

In one or more embodiments, the method may further include forming a protection diode in the substrate, and functionally connecting the protection diode to the first well region through the substrate terminal with a metal line.

In one or more embodiments, forming the first well region may comprise patterning a photoresist layer on the top surface of the substrate, performing ion implantation or diffusion on the substrate using the patterned photoresist layer to form the first well region, and removing the photoresist layer.

In one or more embodiments, forming the second well region may comprise patterning a photoresist layer on the top surface of the substrate, performing ion implantation or diffusion on the substrate using the patterned photoresist layer to form the second well region, and removing the photoresist layer.

In one or more embodiments, forming the gate oxide may comprise depositing a dielectric material layer on the top surface of the substrate and on the top surface of the first well region using physical vapor deposition (PVD) or chemical vapor deposition (CVD), patterning a photoresist layer on a top surface of the dielectric material layer, etching the dielectric material layer using the patterned photoresist layer to form the gate oxide, and removing the photoresist layer.

In one or more embodiments, forming the source and the drain may comprise patterning a photoresist layer on the top surface of the first well region, performing ion implantation or diffusion on the first well region using the patterned photoresist layer to form the source and the drain, and removing the photoresist layer.

In one or more embodiments, forming the substrate terminal may comprise patterning a photoresist layer on the top surface of the first well region, performing ion implantation or diffusion on the first well region using the patterned photoresist layer to form the substrate terminal, and removing the photoresist layer.

Other and further aspects and features will be evident from reading the following detailed description of the embodiments.

BRIEF DESCRIPTION OF THE DRAWINGS

The drawings illustrate the design and utility of embodiments, in which similar elements are referred to by common reference numerals. These drawings are not necessarily drawn to scale. In order to better appreciate how the above-recited and other advantages and objects are obtained, a more particular description of the embodiments will be rendered, which are illustrated in the accompanying drawings. These drawings depict only typical embodiments and are not therefore to be considered limiting in scope.

FIG. 3-1 illustrates a cross-sectional view of a pMOS with a second n-well region undergoing a plasma-based process according to some embodiments.

FIG. 3-2 illustrates a top view of the pMOS with a second n-well region of FIG. 3-1 according to some embodiments.

FIGS. 6-1 to 6-9 are cross-sectional views illustrating a method of manufacturing a pMOS with a second n-well region according to some embodiments.

DETAILED DESCRIPTION

Figure 1:
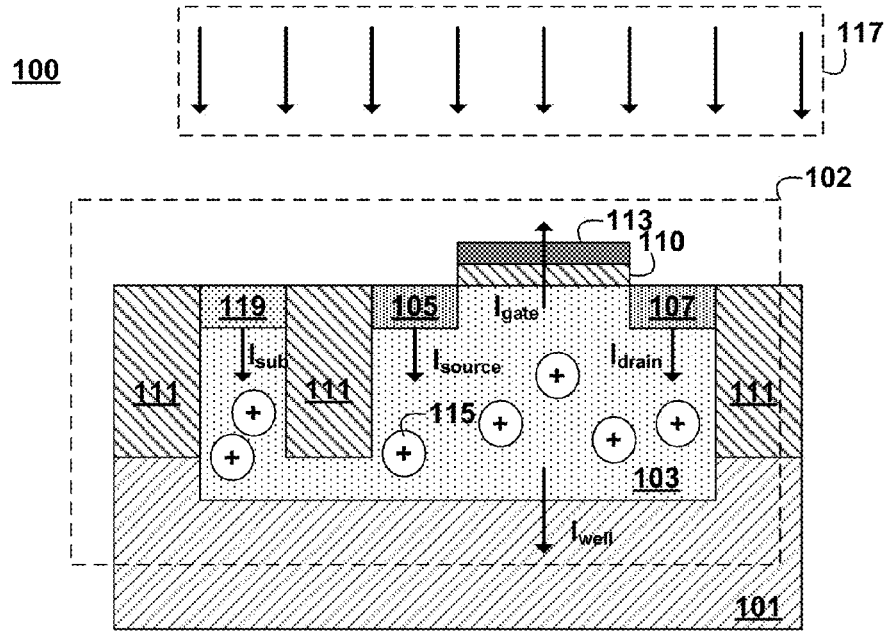
FIG. 1 illustrates a cross-sectional view of a p-type metal oxide semiconductor field effect transistor (pMOS) undergoing a plasma-based process.

Various embodiments are described hereinafter with references to the figures. It should be noted that the figures are not drawn to scale and that the elements of similar structures or functions are represented by like reference numerals throughout the figures. It should be noted that the figures are only intended to facilitate the description of the embodiments. They are not intended as an exhaustive description of the claimed invention or as a limitation on the scope of the claimed invention. In addition, an illustrated embodiment need not have all the aspects or advantages shown. An aspect or an advantage described in conjunction with a particular embodiment is not necessarily limited to that embodiment and can be practiced in any other embodiment even if not so illustrated. Also, reference throughout this specification to "some embodiments" or "other embodiments" means that a particular feature, structure, material, or characteristic described in connection with the embodiments is included in at least one embodiment. Thus, the appearances of the phrase "some embodiments" or "other embodiments" in various places throughout this specification are not necessarily referring to the same embodiment or embodiments.

FIG. 1 illustrates a cross-sectional view of a typical p-type metal oxide semiconductor field effect transistor (pMOS) 102 of an integrated circuit 100 undergoing a plasma-based process. The pMOS 102 includes a p-type substrate 101, an n-well region 103, a source 105, a drain 107, an n-well substrate terminal 119, and a gate electrode 113. The gate electrode 113 may be insulated from the n-well region 103 by a gate oxide 110 comprising dielectric material such as silicon dioxide. The integrated circuit 100 may further include isolation trenches 111 to isolate the pMOS 102 from other active areas of the integrated circuit, such as for example, other transistors (e.g., nMOS) or diodes (not shown) as well as to isolate the n-well substrate terminal 119 from the source 105 and drain 107. Operation of the pMOS 102 involves applying a voltage to the oxide-insulated gate electrode 113 to induce a conducting channel in the n-well region between the source and drain.

During the fabrication process, the pMOS 102 may undergo various plasma-based processes. Plasma-based processes may include plasma etching, plasma-assisted chemical vapor deposition (PECVD), or physical vapor deposition (PVD), low pressure chemical vapor deposition (LPCVD), photo-resist removal, and various ion implantations, for example.

Because plasma 117 comprises charged particles, when the pMOS 102 is exposed to plasma 117, charged particles 115 are induced in the source 105, drain 107, and n-well substrate terminal 119 of the pMOS 102. These charged particles flow from the source 105, drain 107, and n-well substrate terminal 119 into the n-well region 103 of the pMOS 102. As illustrated, the rate of particle flow from source 105 to n-well region 103 is denoted by $I_{source}$, the rate of particle flow from drain 107 to n-well region 103 is denoted by $I_{drain}$, and the rate of particle flow from n-well substrate terminal 119 to n-well region 103 is denoted by $I_{sub}$.

In order for the pMOS 102 to maintain functionality, the charged particles 115 that are built up within the n-well region 103 must be discharged by way of a discharge path. The n-well region 103/p-type substrate 101 junction (i.e., the interface between the n-well region 103 and the p-type substrate 101) forms one discharge path for the charged particles 115 to travel. The rate of particle flow from n-well region 103 to p-substrate 101 is denoted by $I_{well}$.

However, the result of plasma processes may lead to a magnitude of charged particles 115 being built up in the n-well region 103 that exceeds the n-well region/p-type substrate junction's capacity to discharge. Said otherwise, a combination of the rate of particle flow $I_{source}$ from the source to the n-well region 103, the rate of particle flow $I_{drain}$ from the drain 107 to the n-well region 103, and the rate of particle flow $I_{sub}$ from the n-well substrate terminal 119 to the n-well region 103 may exceed the rate of particle flow $I_{well}$ from the n-well region 103 to the p-type substrate 101. When the magnitude of charged particles 115 built up in the n-well region 103 exceeds the n-well region/p-type substrate junction's capacity to discharge, the excess charged particles 115 discharge through the gate oxide 110. The rate of particle flow from n-well region 103 to the gate oxide 110 is denoted by $I_{gate}$.

Discharge of charged particles 115 through the gate oxide 110 is highly undesirable because it damages the gate oxide 110 resulting in non-optimal or inoperable use of the pMOS 102.

Figure 2:
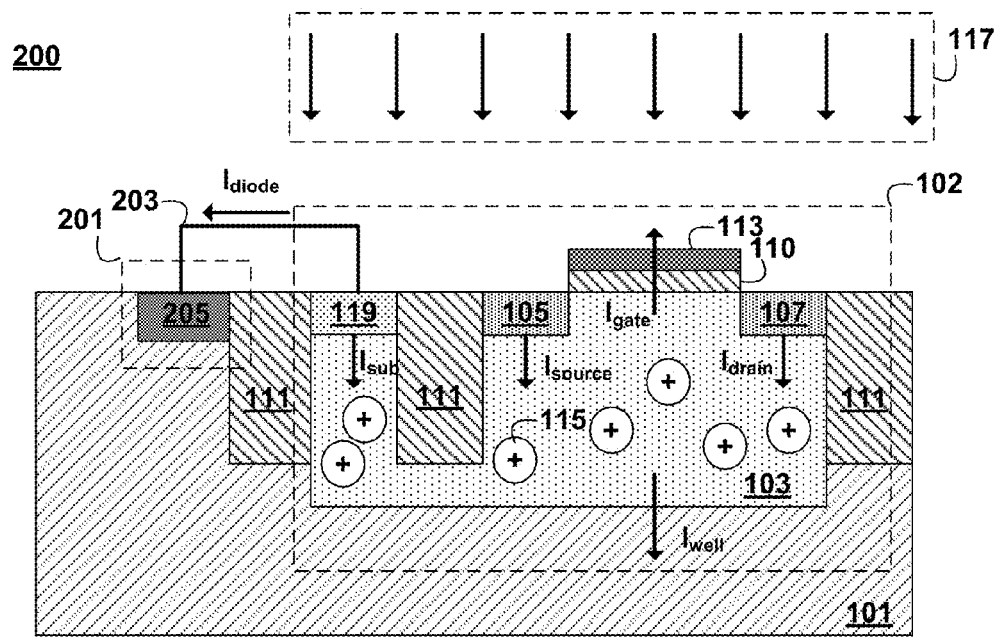
FIG. 2 illustrates a cross-sectional view of a pMOS with an n-well protection diode undergoing a plasma-based process.

One approach for protecting the pMOS from gate oxide damage involves supplementing the pMOS with an n-well protection diode to provide an additional discharge path for charged particles built up in the n-well region of the pMOS. FIG. 2 illustrates a cross-sectional view of a pMOS 102 of an integrated circuit 200 with an n-well protection diode 201 undergoing a plasma-based process.

The integrated circuit 200 of FIG. 2 includes an additional n-well protection diode 201. The n-well protection diode 201 is formed by the combination of an n-type region 205 and the p-type substrate 101. As illustrated in FIG. 2, the n-well protection diode 201 is functionally connected to the n-well region 103 through the n-well substrate terminal 119 by a metal line 203. The n-well protection diode 201 provides an additional discharge path for charged particles induced in the n-well region 103 of the pMOS 102 by plasma-based processes to supplement the discharge path provided by the n-well region 103/p-type substrate 101 junction. As illustrated, the rate of particle flow from n-well substrate terminal 119 to n-well protection diode 201 is denoted by $I_{diode}$.

While the addition of an n-well protection diode 201 does provide an additional discharge path for charged particles built up in the n-well region 115 by a plasma-based process, this additional discharge path may still be insufficient for protecting the gate oxide 110 against discharge. Said otherwise, the magnitude of charged particles 115 built up in the n-well region 103 nevertheless may exceed the n-well region 103/p-type substrate 101 junction's capacity to discharge even with the addition of an n-well protection diode 201 providing an additional discharge path, and as such, the excess charged particles 115 may continue to discharge through the gate oxide 110. Thus, the rate of particle flow $I_{diode}$ from the n-well region 103 to the n-well protection diode 201 and the rate of particle flow $I_{well}$ from the n-well region 103 to the p-type substrate is exceeded by the rate of particle flow $I_{source}$ from the source 105 to the n-well region 103 and the rate of particle flow $I_{drain}$ from the drain 107 to the n-well region 103. As such, excess charged particles 115 built up in the n-well region 103 may still discharged through the gate oxide 110 thereby resulting in non-optimal or inoperable use of the pMOS 102.

The n-well protection diode 201 may also suffer from an additional limitation. Because the n-well protection diode 201 only forms an additional discharge path for charged particles when functionally connected to the n-well region 103 of the pMOS 102 by a metal line, the n-well protection diode 201 may only be effective for facilitating discharge of charged particles induced in the source/drain for back-end-of-the-line (BEOL) plasma-based processes. BEOL refers to fabrication processes that form metal connections for various components of an integrated circuit. Front-end-of-the-line (FEOL) refers to fabrication processes that occur prior to formation of metal connections for various components of an integrated circuit. Because the n-well protection diode 201 is not functionally connected to the n-well region 103 of the pMOS 102 prior to formation of metal contacts, the n-well protection diode 201 is essentially ineffective for front-end-of-the-line (FEOL) plasma-based processes.

Figures 1, 3:
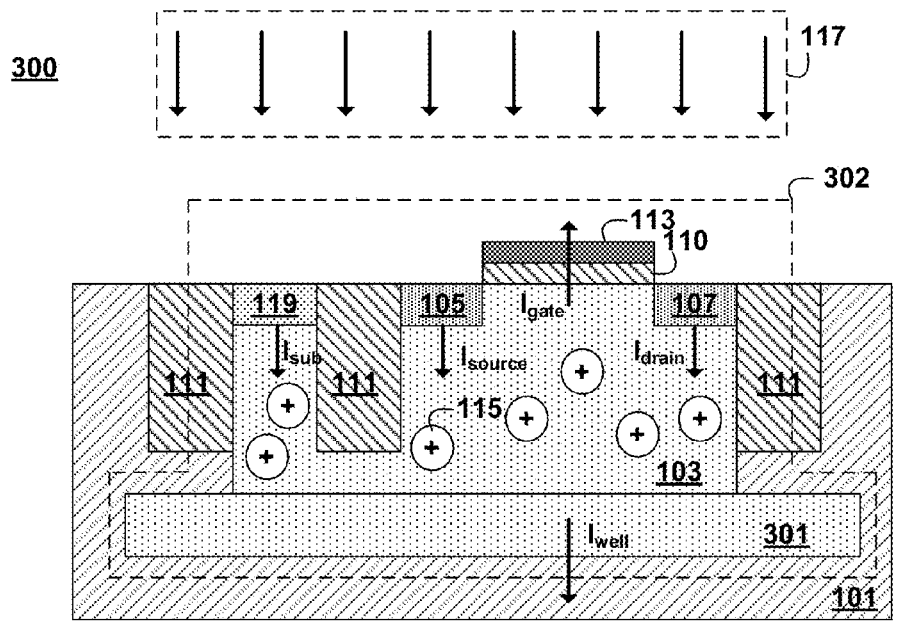
Figures 2, 3:
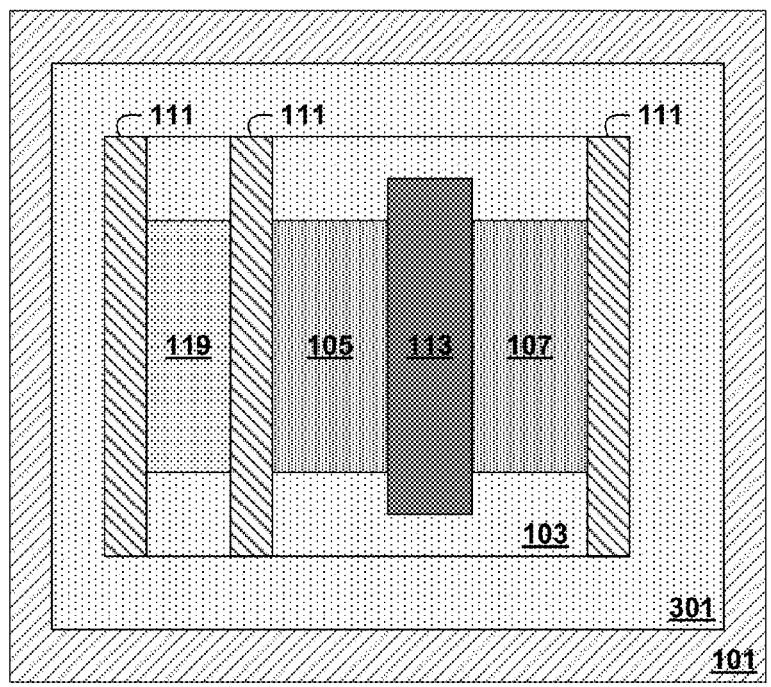

FIG. 3-1 illustrates a cross-sectional view of a pMOS 302 of an integrated circuit 300 undergoing a plasma-based process according to some embodiments and FIG. 3-2 illustrates a top-view of the same integrated circuit 300. FIGS. 3-1 and 3-2 should be viewed concurrently with respect to the following description. The pMOS 302 includes a p-type substrate 101 with a first n-well region 103 located in the p-type substrate 101. A top surface of the first n-well region 103 is aligned with a top surface of the p-type substrate 101. In other embodiments, the top surface of the first n-well region 103 may be offset from the top surface of the p-type substrate 101. A p-type source 105, p-type drain 107, and an n-type n-well substrate terminal 119 are located in the first n-well region 103. A top surface of the source 105, a top surface of the drain 107, and a top surface of the n-well substrate terminal 119 are aligned with a top surface of the first n-well region 103. In other embodiments, the top surface of the source 105, the top surface of the drain 107, the top surface of the n-well substrate terminal 119 or any combination of the three, may be offset from the top surface of the first n-well region 103. A gate electrode 113 is located above a portion of an insulating layer, which will be referred to herein as the gate oxide 110. A pair of isolation trenches 111 may be located in the p-type substrate 101 adjacent to the first n-well region 103 to isolate the pMOS 302 from other active areas (not shown) of the integrated circuit 300. Another isolation trench 111 may be located within the first n-well region 103 to isolate the n-well substrate terminal 119 from the source 105 and drain 107. The pMOS 302 additionally includes a second n-well region 301 located within the substrate 101 below the first n-well region 103 to facilitate discharge of charged particles 115 induced by plasma-based processes, which will be discussed in further detail below.

In some embodiments, the first n-well region 103 may have a depth anywhere from 0.25 µm to 0.5 µm. In some embodiments, the isolation trenches 111 may each have a depth anywhere from 0.25 µm to 0.5 µm. In some embodiments, the isolation trenches 111 may have the same depth as the first n-well region. In some embodiments, the second n-well region 301 may have a depth anywhere from 0.25 µm to 0.5 µm.

The second n-well region 301 is configured such that a surface area of the second n-well region 301 is greater than a surface area of the first n-well region 103. The second n-well region 301 is functionally connected to the first n-well region 103 and is located at a depth below the isolation trenches 111 such that it can increase n-well/p-type substrate junction area.

As discussed above, when the pMOS 302 undergoes a plasma-based process, charged particles 115 are induced in the source 105, drain 107, and n-well substrate terminal 119 of the pMOS 302 by the plasma 117. These charged particles 115 flow from the source 105, drain 107, and n-well substrate terminal 119 into the first n-well region 103 of the pMOS 302. The rate of particle flow from source 105 to first n-well region 103 is denoted by $I_{source}$, the rate of particle flow from drain 107 to first n-well region 103 is denoted by $I_{drain}$, and the rate of particle flow from n-well substrate terminal 119 to first n-well region is denoted by $I_{sub}$. In order for the pMOS 302 to maintain functionality, the charge particles 115 that are built up in the first n-well region 103 must be discharged by way of a discharge path. A discharge path may be provided by the junction formed by the first n-well region 103 and the p-type substrate 101. This discharge path may also be provided by the junction formed by the second n-well region 301 and the p-type substrate 101. Because the second n-well region 301 is functionally connected to the first n-well region 103, a majority of charged particles 115 built up in the first n-well region 103 first flow into the second n-well region 301, and are then discharged through the second n-well region 301/p-type substrate 101 junction. The rate of particle flow from the second n-well region 301 to the p-type substrate 101 is denoted by $I_{well}$.

The rate of particle flow $I_{well}$ from the second n-well region 301 to the p-type substrate 101 is dependent on the surface area of the second n-well region 301. The greater the surface area is for the second n-well region 301, the greater the junction area is between the second n-well region 301 and the p-type substrate 101, and thus the higher the rate of particle flow $I_{well}$ from the second n-well region 301 to the p-type substrate 101. Thus, by configuring the second n-well region 301 to have a greater surface area than the first n-well region 103, a higher rate of particle flow $I_{well}$ from the second n-well region 301 to the p-type substrate 101 may be achieved to fully compensate for the charged particles 115 induced by plasma-based processes. In this way, built-up charged particles 115 in the first n-well region 103 may be full discharged through the second n-well region 301/p-type substrate 101 junction such that no charged particle flow occurs through the gate oxide 110. Said otherwise, the surface area of the second n-well region 301 may be configured such that the rate of particle flow $I_{well}$ from the second n-well region 301 to the p-type substrate 101 exceeds a combination of the rate of particle flow $I_{source}$ from the source 105 to the first n-well region 103, the rate of particle flow $I_{drain}$ from the drain 107 to the first n-well region 103, and the rate of particle flow $I_{sub}$ from the n-well substrate terminal 119 to the first n-well region 103.

Introducing a second n-well region 301 functionally connected to the first n-well region 103 with a greater surface area than the first n-well region 103 is preferred over simply extending the surface area of the first n-well region 103 to increase the rate of flow of charged particles. Normally, increasing the first n-well region 103 will lead to a larger layout area, which will result in a higher cost for implementing the final integrated chip circuit. However, the second n-well region 301 is not constrained by the same design parameters as the first n-well region 103. As such, the second n-well region 301 may have a much greater surface area than that of the first n-well region 103 without affecting the functionality of neighboring active areas in the integrated circuit 300. This is because the second n-well region 301 is located at such a depth within the p-type substrate 101 that it will negligibly affect neighboring active areas.

Although the second n-well region 301 of the pMOS 302 in FIG. 3-1 may be configured to have a surface area great enough to fully compensate for the charged particles induced by plasma-based processes, there may be situations where the pMOS 302 of FIG. 3-1 may be further supplemented by an n-well protection diode. For example, the n-well protection diode may provide additional gate oxide protection where BEOL processes induce a greater magnitude of charged particles than FEOL processes. As another example, the second n-well region 301 may be constrained by a design parameter (different than the constraint imposed on the first n-well region 103) and as such an additional n-well protection diode may be desirable to fully compensate for the charged particles induced by plasma-based processes.

Figure 4:
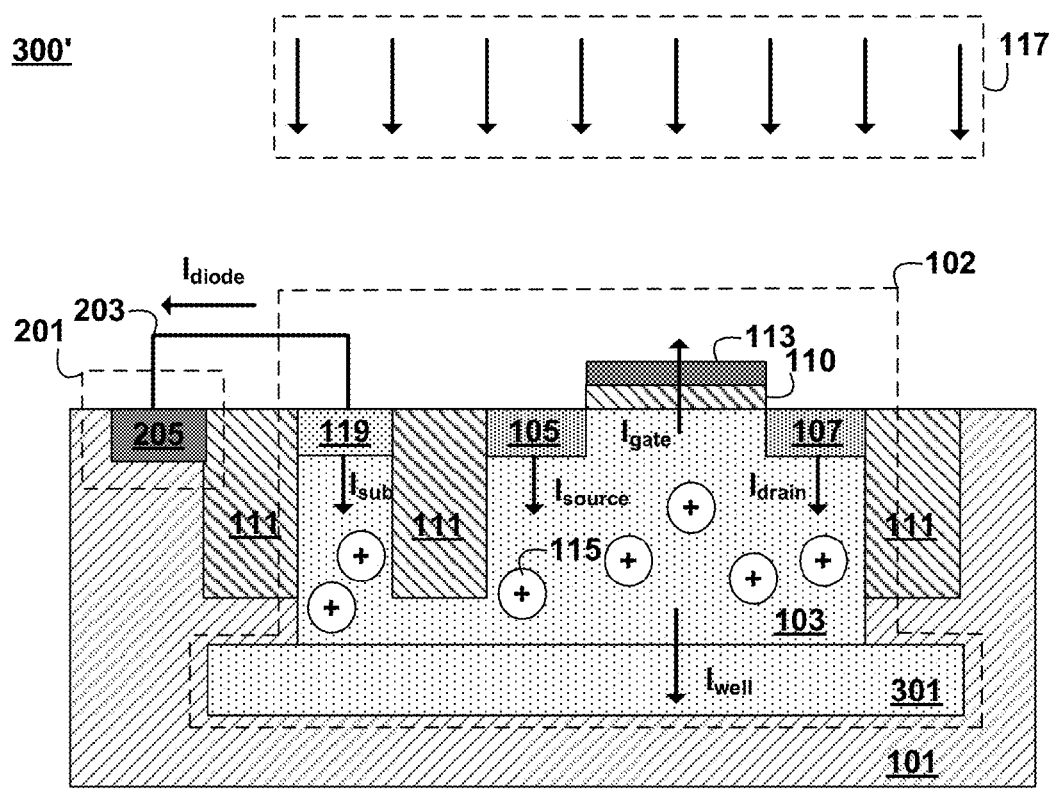
FIG. 4 illustrates a cross-sectional view of a pMOS with a second n-well region and an n-well protection diode undergoing a plasma-based process according to some embodiments.

FIG. 4 illustrates a cross-sectional view of the pMOS 302 of FIG. 3-1 with the addition of an n-well protection diode 201, undergoing a plasma-based process according to some embodiments. The pMOS 302 of FIG. 4 is substantially the same as the pMOS 302 of FIG. 3-1, and as such will not be described in detail for purposes of simplicity. As discussed above, the n-well protection diode 201 is formed by a combination of an n-type region 205 and the p-type substrate 101.

As illustrated in FIG. 4, the n-well protection diode 201 is functionally connected to the first n-well region 103 through the n-well substrate terminal 119 of the pMOS 302 by way of a metal line 203. The n-well protection diode 201 provides an additional discharge path for charged particles 115 built up in the first n-well region 103 of the pMOS 302 by plasma-based processes to supplement the discharge path provided by the second n-well region 301/p-type substrate 101 junction. As illustrated, the rate of particle flow from the first n-well region 103 to the n-well protection diode 201 is denoted by $I_{diode}$.

The addition of an n-well protection diode 201 supplements the gate oxide 110 protection provided by the second n-well region 301. This may be beneficial in situations where the second n-well region 301 of the pMOS 302 may be limited to a surface area unable to fully compensate for the charged particles 115 induced by plasma-based processes.

Figure 5:
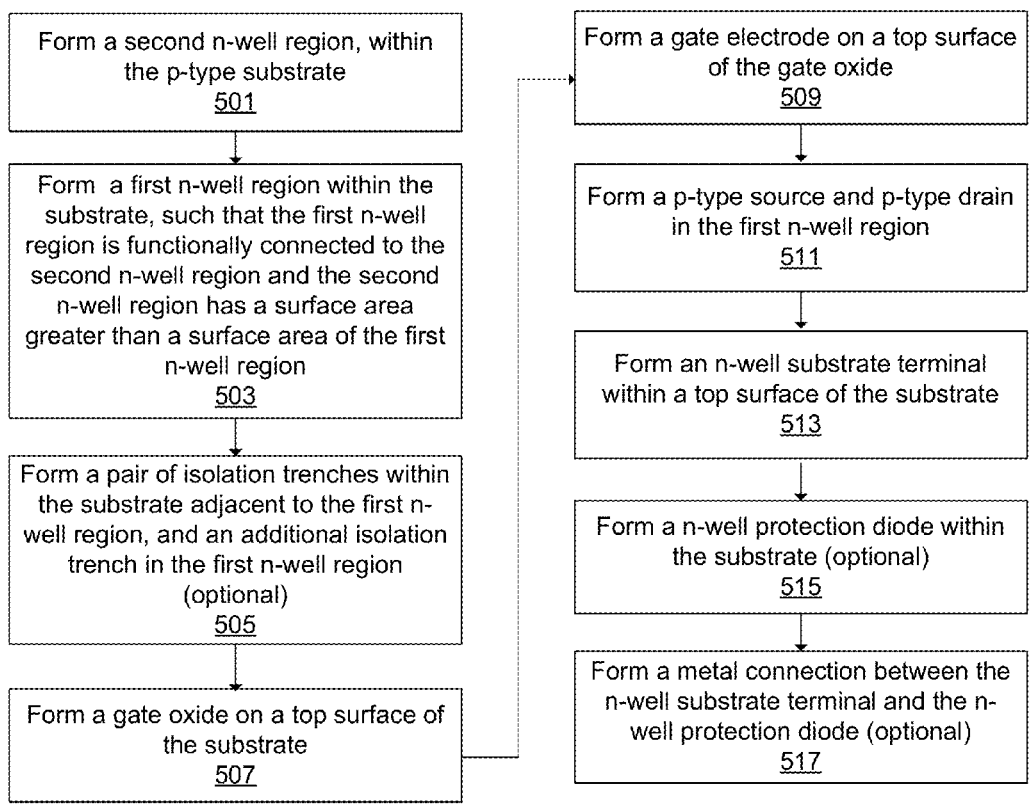
FIG. 5 is a flow diagram illustrating a method of manufacturing a pMOS with a second n-well region according to some embodiments.

FIG. 5 is a flow diagram illustrating a method for fabricating a pMOS according to some embodiments, and FIGS. 6-1 to 6-9 are cross sectional views illustrating the method of FIG. 5. FIGS. 5 and 6-1 to 6-9 are to be viewed concurrently with reference to the following description.

Figures 1, 6:
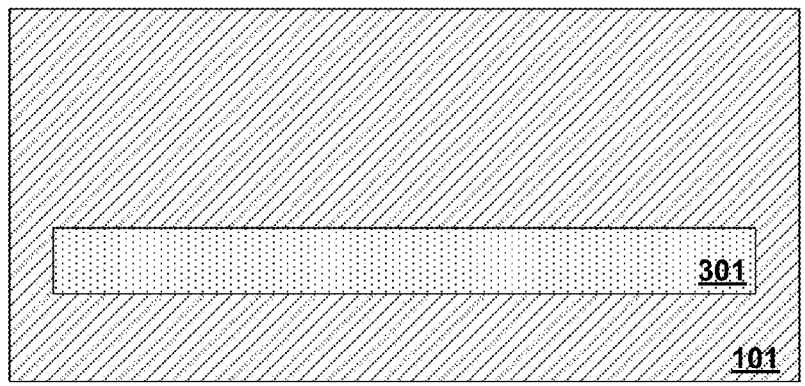
Figures 2, 6:
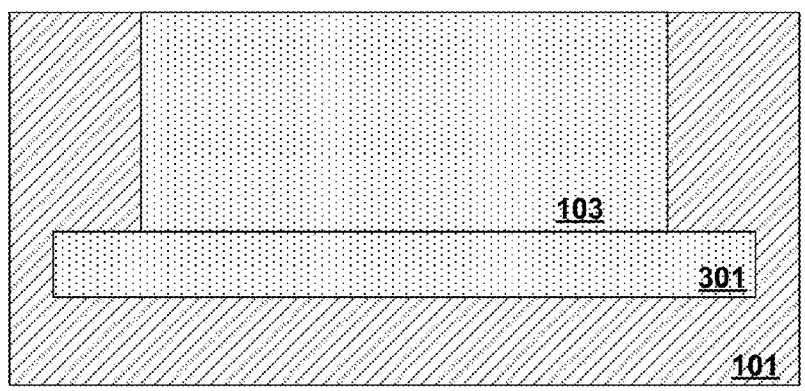
Figures 3, 6:
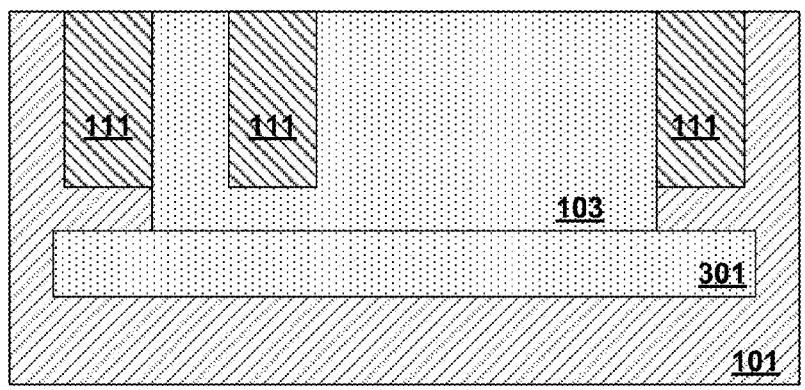
Figures 4, 6:
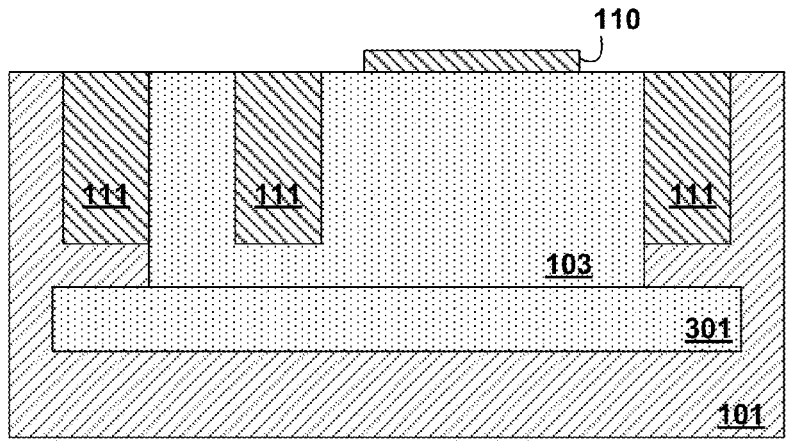
Figures 5, 6:
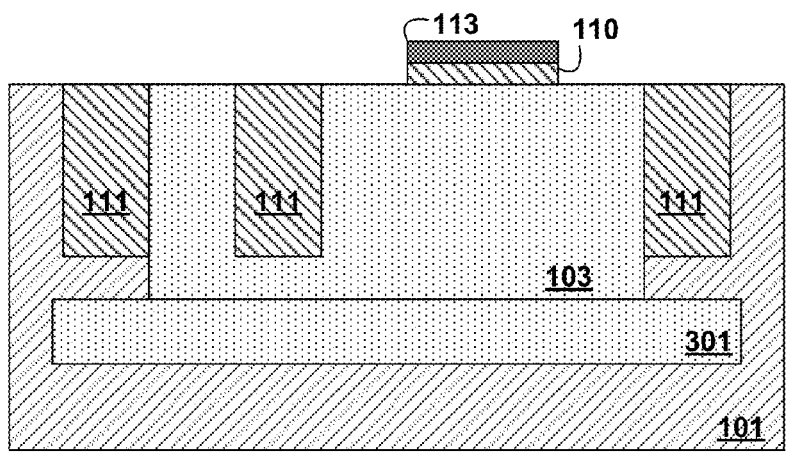
Figure 6:
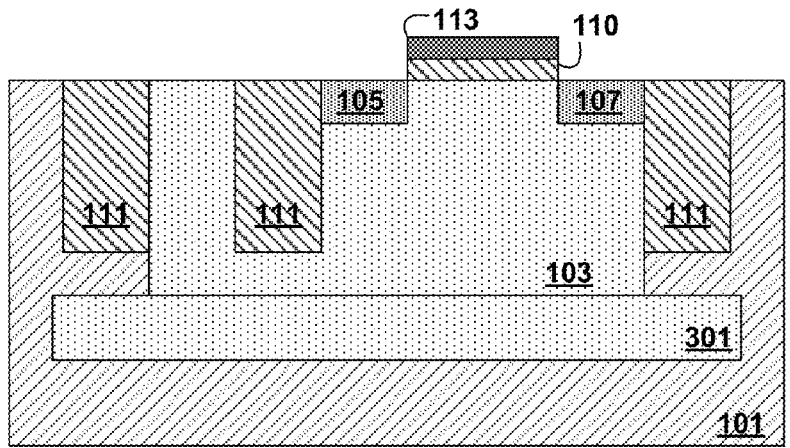

Initially the second n-well region 301 is formed within a p-type substrate 101 as described in item 501 and as illustrated in FIG. 6-1. The second n-well region 301 is substantially the same as the second n-well region 301 described above in FIGS. 3-1 and 3-2. Formation of the second n-well region 302 may involve patterning a photoresist layer on a top surface of the substrate 101, performing an ion implantation or diffusion on the substrate 101 using the patterned photoresist layer to form the second n-well region 302, and then removing the photoresist. Ion implantation and diffusion are techniques well-known to one ordinarily skilled in the art, and as such will not be described in detail. The size and location of the second n-well region 302 is dependent on the photoresist pattern and the energy level used to perform ion implantation/diffusion, and such parameters may be adjusted by varying the photoresist pattern and energy level. The location of the second n-well region 302 after ion implantation/diffusion should be configured such that it does not affect any neighboring active areas of the integrated circuit.

The first n-well region 103 may then be formed in the substrate 101 such that the first n-well region 103 is functionally connected to the second n-well region 301, and the second n-well region 301 has a surface area greater than a surface area of the first n-well region 103 as described in item 503 and as illustrated in FIG. 6-2. Formation of the first n-well region 103, may also involve patterning a photoresist layer on a top surface of the substrate 101, performing an ion implantation or diffusion on the substrate 101 using the patterned photoresist layer in order to form the first n-well region 103, and then removing the photoresist. The size and location of the first n-well region 103 is also dependent on the photoresist pattern and the energy level used to perform ion implantation/diffusion, and such parameters may be adjusted by varying the photoresist pattern and energy level. The size and depth of the first n-well region 103 may be configured to meet design parameters for an integrated circuit.

A pair of isolation trenches 111 may be optionally formed in the substrate 101 adjacent to the first n-well region 103 and an additional isolation trench 111 may be formed within the first n-well region 103 as described at item 505 and as illustrated in FIG. 6-3. Formation of the isolation trenches 111 may involve patterning a photoresist layer on a top surface of the substrate 101, performing an etch on the substrate 101 using the patterned photoresist layer in order to form a pair of trenches 111 adjacent to the first n-well region 103 and an additional isolation trench 111 within the first n-well region 103, depositing silicon dioxide within each trench, and removing the photoresist layer and any excess silicon dioxide. As discussed above, the pair of isolation trenches 111 may be formed to isolate the pMOS from other active areas of the integrated circuit and the additional isolation trench 111 may be formed to later isolate the n-well substrate terminal from the source and drain.

A gate oxide 110 is then formed on a top surface of the substrate 101 and on a top surface of the first n-well region 103, as described in item 507 and as illustrated in FIG. 6-4. Formation of the gate oxide 110 involves first depositing a dielectric material, such as for example silicon dioxide, on the top surface of the substrate 101 using physical vapor deposition (PVD), chemical vapor deposition (CVD), rapid-thermal-oxidation (RTO), or decoupled plasma nitridation/post-nitridation anneal (DPN/PNA). A photoresist layer is then patterned on a top surface of the dielectric material layer, and the dielectric material layer is etched using the patterned photoresist layer to form the gate oxide 110. The photoresist layer is then removed.

A gate electrode 113 is then formed on a top surface of the gate oxide as described in item 509 as illustrated in FIG. 6-5. Formation of the gate electrode 113 involves depositing a polysilicon layer or metal layer on the gate oxide 110, patterning a photoresist layer on a top surface of the polysilicon layer, etching the polysilicon using the patterned photoresist layer to form the gate electrode 113, and removing the photoresist layer and excess polysilicon.

A p-type source 105 and p-type drain 107 are then formed in the first n-well region 103 as described in item 511 and as illustrated in FIG. 6-6. Formation of the source 105 and drain 107 may involve patterning a photoresist layer on the top surface of the first n-well region 103, performing ion implantation or diffusion on the first n-well region 103 using the patterned photoresist layer to form the source 105 and the drain 107, and removing the photo resist layer. The size and location of the source 105 and drain 107 are also dependent on the photoresist pattern and the energy level used to perform ion implantation/diffusion, and such parameters may be adjusted by varying the photoresist pattern and energy level.

Figures 6, 7:
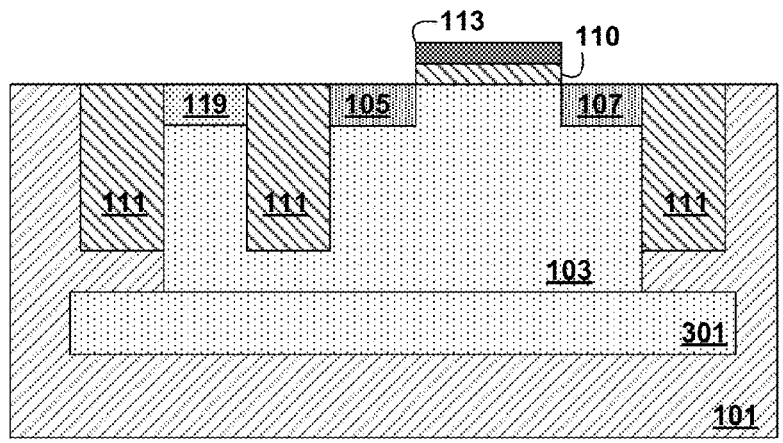

An n-well substrate terminal 119 is then formed in the first n-well region 103 as described in item 513 and as illustrated in FIG. 6-7. Formation of the n-well substrate terminal 119 may involve patterning a photoresist layer on the top surface of the first n-well region 103, performing ion implantation or diffusion on the first n-well region 103 using the patterned photoresist layer to form the n-well substrate terminal 119, and removing the photo resist layer. The size and location of the n-well substrate terminal 119 is also dependent on the photoresist pattern and the energy level used to perform ion implantation/diffusion, and such parameters may be adjusted by varying the photoresist pattern and energy level.

Figures 6, 7, 8:
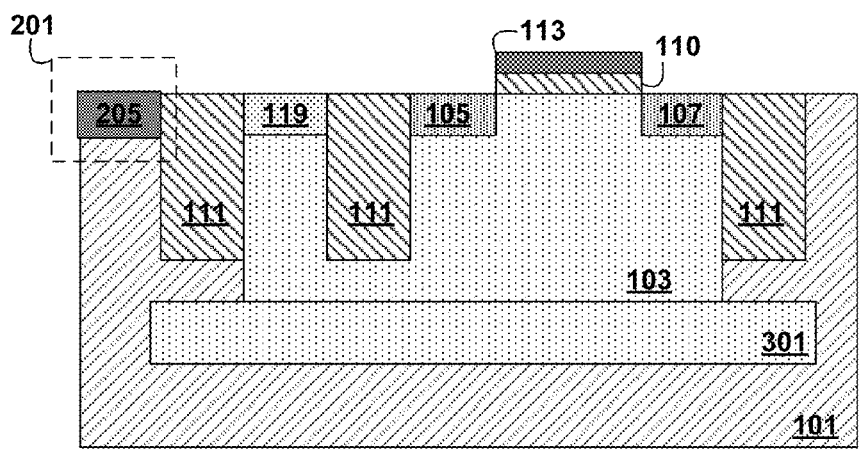
Figures 6, 7, 8, 9:
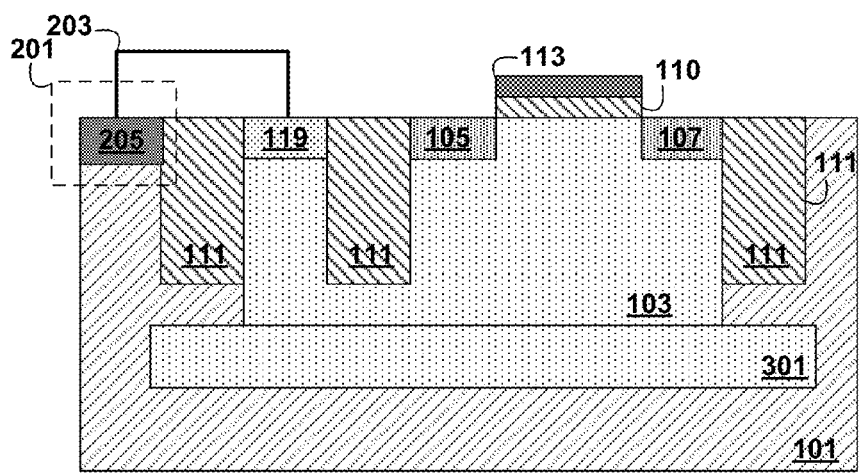

An n-well protection diode 201 may then be optionally formed in the substrate 101 as described in item 515 and as illustrated in FIG. 6-8. Formation of the n-well protection diode 201 may involve patterning a photoresist layer on a top surface of the substrate 101, performing an ion implantation/diffusion on the substrate 101 using the patterned photoresist layer to form an n-type region 205, and removing the photo resist layer. The n-type region 205 and p-type substrate 101 together form the n-well protection diode 201. In other embodiments, the n-well protection diode 201 may be formed during item 513 (e.g., formation of the n-well substrate terminal within a top surface of the substrate).

A metal connection 203 may then be optionally formed between the n-well substrate terminal 119 and the n-well protection diode 201, as described in item 517 and as illustrated in FIG. 6-9.

The above process flow is described with reference to a particular ordering of process actions. However, the ordering of many of the described process actions may be changed without affecting the scope or operation of the invention. One ordinarily skilled in the art will recognize that various steps may be performed in a different order to achieve the same result. Likewise, it is important to note that while particular techniques have been described for implementing certain process steps, one ordinarily skilled in the art will recognize that other techniques may also exist for implementing those steps. In some embodiments, the pair of isolation trenches 111 may be formed before the formation of the first n-well region 103, with the first n-well region 103 being subsequently formed next to the isolation trenches 111. In other embodiments, the n-well substrate terminal 119 and the n-well protection diode 201 may be formed simultaneously.

It is important to note that while the above embodiments have been described with reference to a pMOS with a p-type substrate, an n-well region, and a p-type source and drain, one ordinarily skilled in the art will recognize that the above description may be extended to encompass an nMOS device with an n-type substrate, a p-well region, and an n-type source and drain. Likewise, an nMOS device may include a p-well protection diode formed by a combination of a p-type region and the n-type substrate rather than the n-well protection diode discussed above.

Although particular embodiments have been shown and described, it will be understood that they are not intended to limit the claimed invention, and it will be made obvious to those skilled in the art that various changes and modifications may be made without departing from the spirit and scope of the claimed invention. The specification and drawings are, accordingly to be regarded in an illustrative rather than restrictive sense. The claimed invention is intended to cover all alternatives, modifications, and equivalents.

What is claimed is:

1. A metal oxide semiconductor field effect transistor (MOSFET) for an integrated circuit, comprising:
   a substrate of a first conductivity type;
   a first well region of a second conductivity type located in the substrate;
   a second well region of the second conductivity type located within the substrate, wherein the second well region is functionally connected to the first well region and wherein the second well region has a surface area greater than a surface area of the first well region;
   a source of the first conductivity type located in the first well region;
   a drain of the first conductivity type located in the first well region;
   a substrate terminal of the second conductivity type located in the first well region;
   a gate oxide on a top surface of the first well region; and
   a gate electrode located on a top surface of the gate oxide
   wherein a junction area between the second well region and the substrate has a size sufficient to allow particles to flow from the second well region to the substrate at a rate that exceeds a combination of a rate of particle flow from the source to the first well region, a rate of particle flow from the drain to the first well region, and a rate of particle flow from the substrate terminal to the first well region.

2. The MOSFET of claim 1, further comprising:
   a pair of isolation trenches formed in the substrate, wherein each of the isolation trenches is adjacent to the first well region; and
   an additional isolation trench formed in the first well region, the additional isolation trench isolating the substrate terminal from the source and the drain.

3. The MOSFET of claim 2, wherein each of the pair of isolation trenches has a depth anywhere from 0.25 to 0.5 microns.

4. The MOSFET of claim 2, wherein each of the pair of isolation trenches has the same depth as the first well region.

5. The MOSFET of claim 2, wherein each of the pair of isolation trenches comprises silicon dioxide.

6. The MOSFET of claim 1, wherein the gate oxide comprises silicon dioxide.

7. The MOSFET of claim 1, further comprising a protection diode that is functionally connected to the first n-well region through the substrate terminal of the MOSFET by a metal line.

8. The MOSFET of claim 1, wherein the first conductivity type is p-type and the second conductivity type is n-type.

9. The MOSFET of claim 1, wherein the first conductivity type is n-type and the second conductivity type is p-type.

10. The MOSFET of claim 1, wherein the first well region has a depth anywhere from 0.25 to 0.5 microns.

11. The MOSFET of claim 1, wherein the second n-well region has a depth anywhere from 0.25 µm to 0.5 µm.

12. The MOSFET of claim 1, wherein the gate electrode comprises polysilicon or metal.

13. A method for fabricating a metal oxide semiconductor field effect transistor (MOSFET) for an integrated circuit, comprising:
    forming in a substrate of a first conductivity type a first well region of a second conductivity type, and a second well region of the second conductivity type, wherein the second well region is formed so that it is functionally connected to the first well region, and the second well region has a surface area greater than a surface area of the first well region;
    forming a gate oxide on a top surface of the first well region;
    forming a gate electrode on a top surface of the gate oxide;
    forming a source and a drain of the first conductivity type in the first well region; and
    forming a substrate terminal in the first well region;
    wherein the second well region and the substrate are formed to create a junction area between the second well region and the substrate, the junction area having a size sufficient to allow particles to flow from the second well region to the substrate at a rate that exceeds a combination of a rate of particle flow from a source to the first well region, a rate of particle flow from the drain to the first well region, and a rate of particle flow from the substrate terminal to the first well region.

14. The method of claim 13, further comprising:
    forming a pair of isolation trenches in the substrate, wherein each of the isolation trenches is adjacent to the first well region; and
    forming an additional isolation trench in the first well region, the additional isolation trench isolating the substrate terminal from the source and the drain.

15. The method of claim 13, further comprising:
    forming a protection diode in the substrate; and
    functionally connecting the protection diode to the first well region through the substrate terminal with a metal line.

16. The method of claim 13, wherein forming the first well region comprises:
    patterning a photoresist layer on the top surface of the substrate;
    performing ion implantation or diffusion on the substrate using the patterned photoresist layer to form the first well region; and
    removing the photoresist layer.

17. The method of claim 13, wherein forming the second well region comprises:
    patterning a photoresist layer on the top surface of the substrate;
    performing ion implantation or diffusion on the substrate using the patterned photoresist layer to form the second well region; and
    removing the photoresist layer.

18. The method of claim 13, wherein forming the gate oxide comprises:
    depositing a dielectric material layer on the top surface of the substrate and on the top surface of the first well region using physical vapor deposition (PVD) or chemical vapor deposition (CVD);
    patterning a photoresist layer on a top surface of the dielectric material layer;
    etching the dielectric material layer using the patterned photoresist layer to form the gate oxide; and
    removing the photoresist layer.

19. The method of claim 13, wherein forming the source and the drain comprises:
    patterning a photoresist layer on the top surface of the first well region;
    performing ion implantation or diffusion on the first well region using the patterned photoresist layer to form the source and the drain; and
    removing the photoresist layer.

20. The method of claim 13, wherein forming the substrate terminal comprises:
    patterning a photoresist layer on the top surface of the first well region;
    performing ion implantation or diffusion on the first well region using the patterned photoresist layer to form the substrate terminal; and
    removing the photoresist layer.

* * * * *